United States Patent
Kawakubo

(10) Patent No.: US 8,541,298 B2
(45) Date of Patent: Sep. 24, 2013

(54) METHOD FOR FABRICATING SEMICONDUCTOR DEVICE

(75) Inventor: Hiroshi Kawakubo, Kanagawa (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 129 days.

(21) Appl. No.: 13/185,002

(22) Filed: Jul. 18, 2011

(65) Prior Publication Data

US 2012/0021598 A1 Jan. 26, 2012

(30) Foreign Application Priority Data

Jul. 21, 2010 (JP) .................................. 2010-163958

(51) Int. Cl.
*H01L 21/44* (2006.01)
(52) U.S. Cl.
USPC .................................. 438/612; 257/E23.011
(58) Field of Classification Search
USPC .................................. 438/612; 257/E23.011
See application file for complete search history.

(56) References Cited

U.S. PATENT DOCUMENTS

| 7,754,616 B2 * | 7/2010 | Kosaka et al. ................ 438/720 |
| 7,989,277 B1 * | 8/2011 | Luh et al. ..................... 438/167 |
| 2005/0250336 A1 | 11/2005 | Komatani |
| 2009/0001478 A1 * | 1/2009 | Okamoto ....................... 257/382 |
| 2011/0081784 A1 * | 4/2011 | Kosaka et al. ................ 438/734 |

FOREIGN PATENT DOCUMENTS

JP 2005-322811 A 11/2005

* cited by examiner

*Primary Examiner* — Shaun Campbell
(74) *Attorney, Agent, or Firm* — Westerman, Hattori, Daniels & Adrian, LLP

(57) ABSTRACT

A method for fabricating a semiconductor device having a GaN-based semiconductor layer on a first surface of a substrate made of SiC, a pad being provided on the GaN-based layer, includes: forming a first via hole in the substrate by etching, with fluorine based gas, from a second surface of the substrate opposite to the first surface, the etching being carried out with the GaN-based layer being used as an etch stopper; and forming a second via hole in the GaN-based semiconductor layer, with chlorine based gas, from a bottom surface of the first via hole, the etching being carried out with the pad being used as an etching stopper, the chlorine based gas being an etchant different from the fluorine based gas.

15 Claims, 2 Drawing Sheets

METHOD FOR FABRICATING SEMICONDUCTOR DEVICE

CROSS-REFERENCE TO RELATED APPLICATION

This application is based upon and claims the benefit of priority of the prior Japanese Patent Application No. 2010-163958 filed on Jul. 21, 2010, the entire contents of which are incorporated herein by reference.

BACKGROUND (i) Technical Field

A certain aspect of the embodiments discussed herein is related to a method for fabricating a semiconductor device.

(ii) Related Art

There is known a semiconductor device using silicon carbide (SiC). For example, nitride-based semiconductor layers (for example, a GaN-based semiconductor layer) are formed on a substrate to form a high electron mobility transistor (HEMT) capable of outputting high power. There is also known a semiconductor device in which a via hole is formed in the SiC substrate (see Japanese Patent Application Publication No. 2005-322811).

Conventionally, a via hole is formed in the SiC substrate by forming a via receiving pad on a semiconductor layer on the surface of the substrate and etching the substrate and the semiconductor layer from the back surface of the substrate continuously. However, the via receiving pad may be partly removed by etching. If etching is controlled to prevent the via receiving pad from being removed, the etching rate decreases.

SUMMARY

According to an aspect of the present invention, there is provided a method for fabricating a semiconductor device having a GaN (gallium nitride)-based semiconductor layer on a first surface of a substrate made of SiC, a pad being provided on the GaN-based layer, including: forming a first via hole in the substrate by etching, with fluorine based gas, from a second surface of the substrate opposite to the first surface, the etching being carried out with the GaN-based layer being used as an etch stopper; and forming a second via hole in the GaN-based semiconductor layer, with chlorine based gas, from a bottom surface of the first via hole, the etching being carried out with the pad being used as an etching stopper, the chlorine based gas being an etchant different from the fluorine based gas.

DETAILED DESCRIPTION

First Embodiment

Figure 1A:
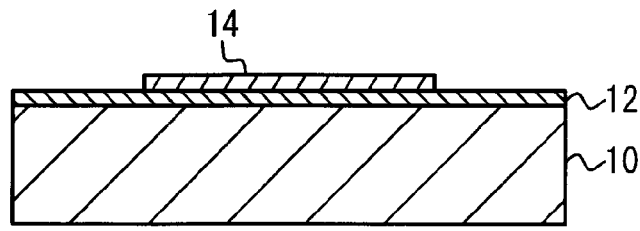
FIGS. 1A through 1D are cross-sectional views that illustrate a method for fabricating a method for fabricating a semiconductor device in accordance with a first embodiment.

FIGS. 1A through 1D are cross-sectional views that illustrate a method for fabricating a semiconductor device 100 in accordance with a first embodiment. Referring to FIG. 1A, a GaN-based semiconductor layer 12, which is a semiconductor layer including GaN, is formed on a surface of a substrate 10 made of SiC. A via receiving pad 14 is provided in a surface area of the semiconductor layer 12 in which a via hole is to be formed. In the following description, one of the two main surfaces of the substrate 10 on which the semiconductor layer 12 is formed is referred to as an upper surface (or first surface), and the other main surface opposite to the former main surface is referred to as a lower surface (or second surface). This definition is similarly applied to the semiconductor layer 12 and the via receiving pad 14.

The semiconductor layer 12 has a multilayer structure, which may be composed of a buffer layer, a channel layer, an electron supply layer and a cap layer. The buffer layer is made of AlN and is 300 nm thick, for example. The channel layer is made of i-GaN and is 1000 nm thick, for example. The electron supply layer is made of n-AlGaN and is 20 nm thick, for example. The cap layer is made of n-GaN and is 5 nm thick, for example. The semiconductor layer 12 is a layer that includes a GaN layer (for example, the above i-GaN channel layer) and may include InGaN, AlGaN or InAlGaN besides GaN.

Figure 1B:
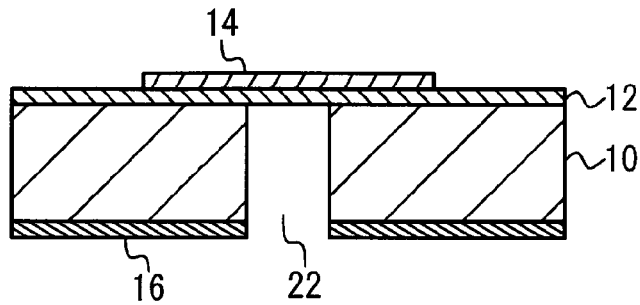

Referring to FIG. 1B, a mask layer 16 is formed on the lower surface of the substrate 10, which is etched with the mask layer 16 being used as a mask. This etching results in a first via hole 22. Since the substrate 10 made of SiC is very harder than the Si substrate, the process for forming via holes in the SiC substrate is different from that in the Si substrate. The present process employs dry etching by plasma, and uses fluorine gas as etching gas. Since the GaN-based semiconductor layer 12 is hardly etched by fluorine gas, the GaN-based semiconductor layer 12 functions as an etch stopper layer, and protects the via receiving pad 14.

Figure 1C:
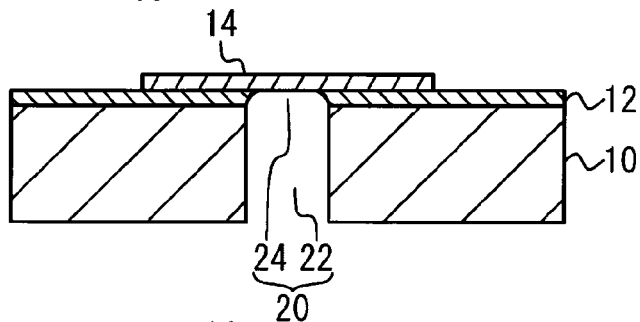

Referring to FIG. 1C, the mask layer 16 is removed and the semiconductor layer 12 is etched with the substrate 10 being used as a mask to form a second via hole 24 in the semiconductor layer 12. The present process employs dry etching by plasma as in the case of forming the first via hole 22, and uses chlorine gas as etching gas. Since the via receiving pad 14 is hardly etched by chlorine gas, the via receiving pad 14 functions as an etch stopper layer.

The above process results in a via hole 20, which is a combination of the first via hole 22 and the second via hole 24.

Figure 1D:
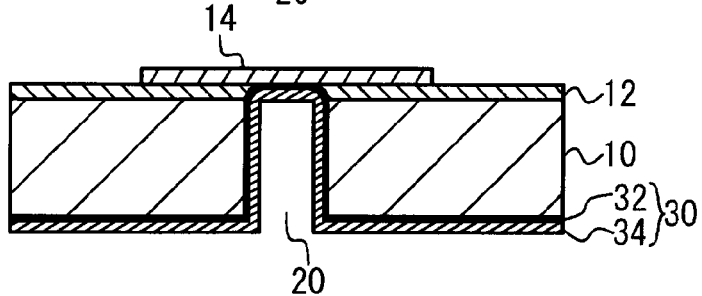

Finally, as illustrated in FIG. 1D, the lower surface of the substrate 10 and the inner wall of the via hole 20 are metalized to form a metal layer 30. The metallization may be implemented by forming a seed layer 32 of Ni by sputtering and then forming a layer 34 made of Au by plating. The metal layer 30 is electrically connected to the via receiving pad 14.

Figure 2:
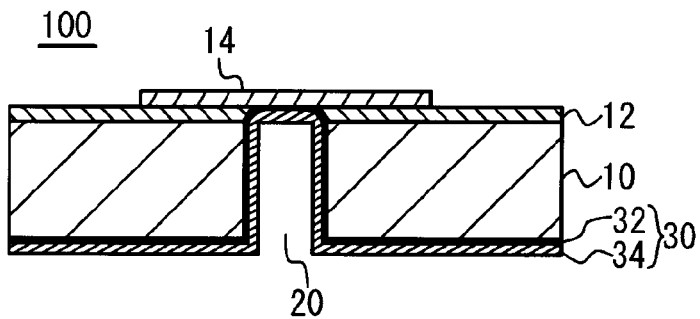
FIG. 2 is a cross-sectional view of the semiconductor device of the first embodiment.

FIG. 2 is a schematic cross-sectional view of the semiconductor device 100. The semiconductor layer 12 is provided on the upper surface of the substrate 10, and the via receiving pad 14 is provided on the upper surface of the semiconductor layer 12. The via hole 20 pierces the substrate 10 and the semiconductor layer 12 and is exposed from the back surface of the substrate 10. The metal layer 30 is provided on the lower surface of the substrate 10 and the inner wall of the via hole 20, and electrically connects the upper and lower surface sides of the substrate 10.

According to the method for fabricating the semiconductor device 100 in accordance with the first embodiment, the substrate and the semiconductor layer 12 are not etched continuously in forming the via hole 20 but are etched separately. That is, the step of forming the via hole 20 is divided into the step of etching the substrate 10 and the step of etching the semiconductor layer 12. In the step of etching the substrate 10 made of SiC, the GaN layer of the semiconductor layer 12 that is to be etched in the next step is used as the etch stopper layer. It is thus possible to protect the via receiving pad 14 from being etched. It is also possible to suppress an unevenness of the fabrication process resulting from an unevenness of the thickness of the substrate 10. The unevenness of the fabrication process increases as the thickness of the substrate 10 increases. In order to obtain the above effects, the thickness of the substrate 10 is preferably 50 to 150 μm, and is more preferably 100 to 150 μm.

The GaN layer in the semiconductor layer 12 is used as the etch stopper layer, so that relatively high power etching can be carried out, as will be described later. Thus, the etching rate can be increased, and the processing time can be reduced. As described above, according to the first embodiment, it is possible to improve the precision in forming the via hole in the SiC substrate and the processing speed.

Figure 3A:
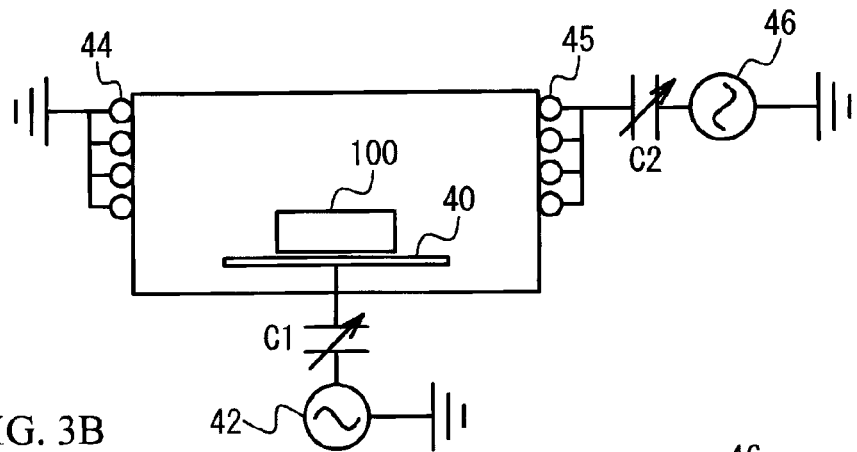
FIGS. 3A through 3C are diagrams that illustrate etching apparatuses.
Figure 3B:
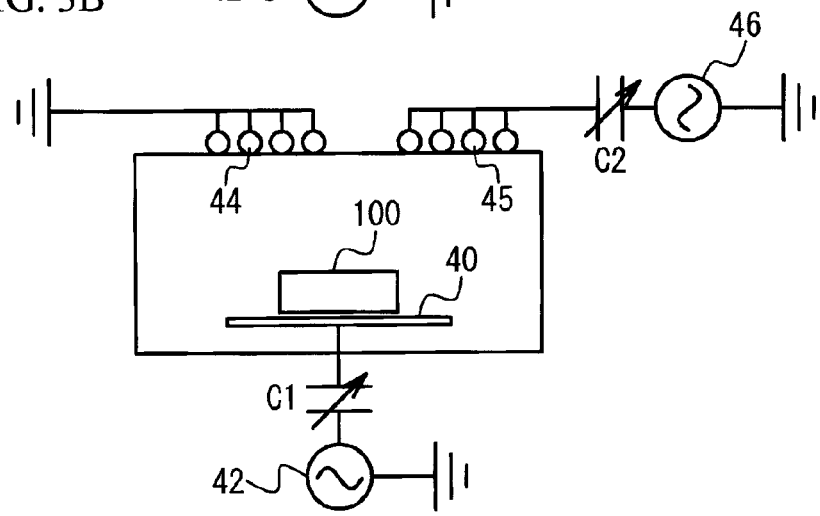
Figure 3C:
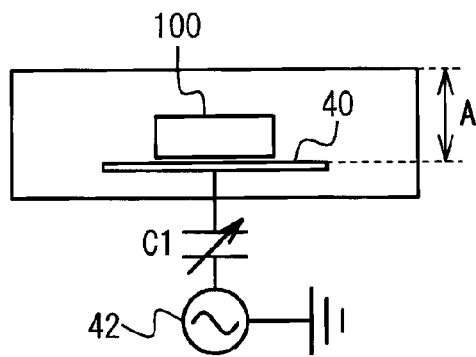

FIGS. 3A through 3C are schematic diagrams of structures of apparatuses that may be used in etching. More particularly, FIG. 3A illustrates an inductively coupled plasma (ICP) apparatus, FIG. 3B illustrates a transformer coupled plasma (TPC) apparatus, and FIG. 3C illustrates a reactive ion etching (RIE) apparatus. A structure common to these three apparatuses is a stage 40 on which the semiconductor device 100 before being processed is placed. The stage 40 is connected to a RF bias power source 42 via a variable capacitor C1 for impedance adjustment.

Referring to FIG. 3A, the ICP apparatus has multiple coils (antennas) for generating inductively coupled plasma, which coils are arranged opposite to each other. Coils 44 on the low-voltage side are grounded, and coils 45 on the high-voltage side are connected to an RF antenna power source 46 via a variable capacitor C2 for impedance adjustment.

Referring to FIG. 3B, the TCP apparatus has multiple coils for generating transformer coupled plasma. The coils 44 on the low-voltage side are grounded, and the coils 45 on the high-voltage side are connected to the RF antenna power source 46 via the variable capacitor C2 for impedance adjustment.

Referring to FIG. 3C, the RIE apparatus does not have any antennal coil. Instead, the distance between the stage 40 and the ceiling of the apparatus indicated by "A" is shorter than that of the other apparatuses. In other words, the RIE apparatus has a narrow gap, which is preferably not greater than 5 mm.

Any of the apparatuses described above is used to form the via hole 20 of the semiconductor device 100. However, as has been described, the ICP or TCP apparatus is preferably used in order to utilize the GaN-based semiconductor layer as the etch stopper layer to perform high-rate etching. In this case, the antenna power is preferably 2500~5000 W, and the bias power is preferably 300~5000 W. When the RIE apparatus is used, the bias power is preferably 3000 W or higher. The etching rate may be improved by both the antenna power and the bias power.

Etching for forming the first via hole 22 uses fluorine gas capable of removing the SiC substrate but not removing the GaN-based semiconductor layer. The fluorine gas is preferably gas including $SF_6$ (sulfur hexafluoride) (for example, mixed gas of $SF_6$ and $O_2$). Etching for forming the second via hole 24 uses chlorine gas capable of removing the GaN-based semiconductor layer and not removing the SiC substrate, and is preferably, $Cl_2$ (chlorine), $SiCl_4$ (silicon tetrachloride) or $BCl_3$ (boron chloride).

The via receiving pad 14 may be a multilayer composed of Ni (nickel) and Au (gold) (Ni is closer to the semiconductor layer 12). Ti may be substituted for Ni. However, since Ni has a higher selectivity ratio to the semiconductor layer 12 chlorine gas than Ti, Ni is preferably used.

The mask layer 16 may be a metal mask that includes any of Cu (copper), Ni and Pt (platinum), for example. It is preferable to use Cu, which has a high selectivity ratio to the substrate 10 for fluorine gas.

The present invention is not limited to the specifically described embodiments but includes various embodiments and variations within the range of the claimed invention.

What is claimed is:

1. A method for fabricating a semiconductor device having a GaN-based semiconductor layer on a first surface of a substrate made of SiC, a pad being provided on the GaN-based layer, comprising:

forming a first via hole in the substrate by etching, with fluorine based gas, from a second surface of the substrate opposite to the first surface, the etching being carried out with the GaN-based layer being used as an etch stopper; and forming a second via hole in the GaN-based semiconductor layer, with chlorine based gas, from a bottom surface of the first via hole, the etching being carried out with the pad being used as an etching stopper, the chlorine based gas being an etchant different from the fluorine based gas, wherein the forming of the first via hole includes etching with a mask layer that is formed on the second surface of the substrate, and the mask includes any of Cu, Ni and Pt, and the forming of the second via hole is carried out by etching with the substrate being used as a mask;

removing the mask used in the forming of the first via hole before carrying out the forming of the second via hole.

2. The method according to claim 1, wherein the forming of the first via hole and the forming of the second via hole uses any of inductively coupled plasma etching, transformer coupled plasma etching and reactive ion etching, and wherein an antenna power in etching is 2500 W to 5000 W, and a bias power is 300 W to 500 W.

3. The method according to claim 1, wherein the fluorine based gas includes $SF_6$.

4. The method according to claim 1, wherein the chlorine based gas includes one of $Cl_2$, $SiCl_4$ and BCl3.

5. The method according to claim 1, wherein the substrate has a thickness of 50 μm to 150 μm.

6. The method according to claim 1, wherein the pad includes Ni.

7. The method according to claim 6, wherein the pad is composed of Ni and Au on the GaN-based semiconductor layer in this order.

8. The method according to claim 1, wherein the GaN-based semiconductor layer includes at least one of GaN, InGaN, AlGaN and InAlGaN.

9. The method according to claim 1, wherein the GaN-based semiconductor layer is composed of a GaN layer, an AlGaN layer, and a GaN layer on the substrate in this order.

10. The method according to claim 1, further comprising forming a metal layer on the second surface of the substrate and inner surfaces of the first and second via-holes.

11. The method according to claim 10, wherein the metal layer comprises Ni and Au on the second surface of the substrate and the inner surfaces of the first and second via-holes in this order.

12. A method for forming a via-hole in a stacked structure of a SiC substrate and a GaN-based semiconductor layer, comprising:

forming a pad layer on the GaN-based semiconductor layer;

forming a mask on a back side surface of the substrate opposite to the GaN-based semiconductor layer;

forming a via-hole by etching the substrate from a side of the back side surface by using an etchant of fluorine based gas and etching the GaN-based semiconductor layer from the side of the back side surface by using an etchant of chlorine based gas which has a composition different from that of the fluorine based gas; and removing the mask before etching the GaN-based semiconductor layer.

13. The method according to claim 12, wherein after removing the mask, the etching of the GaN-based semiconductor layer uses the SiC substrate as a mask.

14. The method according to claim 13, wherein the mask formed on the back side surface of the SiC substrate includes one of Cu, Ni and Pt.

15. The method according to claim 13, wherein the GaN-based semiconductor layer includes at least one of GaN, InGaN, AlGaN and InAlGaN.

* * * * *